United States Patent [19]

Suzuki

[11] Patent Number: 5,368,647
[45] Date of Patent: Nov. 29, 1994

[54] PHOTO-EXCITED PROCESSING APPARATUS FOR MANUFACTURING A SEMICONDUCTOR DEVICE THAT USES A CYLINDRICAL REFLECTING SURFACE

[75] Inventor: Nobumasa Suzuki, Yokohama, Japan

[73] Assignee: Canon Kabushiki Kaisha, Tokyo, Japan

[21] Appl. No.: 208,903

[22] Filed: Mar. 11, 1994

Related U.S. Application Data

[63] Continuation of Ser. No. 901,161, Jun. 19, 1992, abandoned.

[30] Foreign Application Priority Data

Jun. 26, 1991 [JP] Japan ................... 3-181722

[51] Int. Cl.⁵ .............. C23C 16/00; C23C 14/00; B05B 5/00
[52] U.S. Cl. .................... 118/723 I; 118/724
[58] Field of Search ............ 118/722, 723, 724

[56] References Cited

U.S. PATENT DOCUMENTS

| | | | |
|---|---|---|---|
| 4,975,561 | 12/1990 | Robinson et al. | 219/390 |
| 4,989,544 | 2/1991 | Yoshikawa | 118/722 |
| 5,140,469 | 8/1992 | Lamarre et al. | 359/709 |
| 5,179,677 | 1/1993 | Anderson et al. | 118/725 |

FOREIGN PATENT DOCUMENTS

| | | | |
|---|---|---|---|
| 0131431 | 6/1986 | Japan | 118/722 |
| 0263213 | 11/1986 | Japan | 118/722 |
| 0254432 | 11/1987 | Japan | 118/722 |
| 0266822 | 11/1987 | Japan | 118/722 |
| 0041016 | 2/1988 | Japan | 118/722 |
| 64-913 | 1/1989 | Japan | G02B 27/00 |
| 0152718 | 6/1989 | Japan | . |
| 0311573 | 11/1992 | Japan | 118/722 |

Primary Examiner—R. Bruce Breneman
Assistant Examiner—B. Everhart
Attorney, Agent, or Firm—Fitzpatrick, Cella, Harper & Scinto

[57] ABSTRACT

A photo-excited processing apparatus includes a reaction chamber to be filled with raw gas, light excitation means for irradiating a light beam through a light transmissive window formed in the reaction chamber to excite the raw gas, and cylindrical reflection means having a center axis passing through a center of light emission of the light source means and having a reflection plane on an inner surface thereof for directing a portion of the light beam emitted from the light source means to the light transmissive window.

3 Claims, 3 Drawing Sheets

PHOTO-EXCITED PROCESSING APPARATUS FOR MANUFACTURING A SEMICONDUCTOR DEVICE THAT USES A CYLINDRICAL REFLECTING SURFACE

This application is a continuation of application Ser. No. 07/901,161 filed Jun. 19, 1992, now abandoned.

BACKGROUND OF THE INVENTION

1. Field of the Invention

The present invention relates to a photo-excited processing apparatus used to manufacture a semiconductor device or an electronic circuit and a method for manufacturing a semiconductor device by using the same, and more particularly to an improvement in irradiating a high and uniform illumination of light beam to a substrate having a large area in an efficient manner by properly setting á construction of an illumination system.

2. Related Background Art

In a manufacturing process of a semiconductor device and an electronic circuit, particularity a VLSI, a photo-excited processing apparatus has recently been used for various purposes because it principally permits low temperature processing with low damage. For example, it has been applied to cleaning and annealing, and applications to film forming and etching have been proposed.

In a manufacturing process of a VLSI, because of a large area thereof, it is required for an illumination system of the photo-excited processing apparatus that an illumination be high over an extended area of a plane to be illuminated and a distribution of illumination is uniform.

FIGS. 3, 4 and 5 show illumination systems in the conventional photo-excited processing apparatus. In FIG. 3, numeral 31 denotes light source means which comprises a light source 32 is a point light source. The reflector 33 is a parabolic mirror having a center of curvature at a light emitting point of the light source 31. The reflector 33 collects light beams radiated from the light source 32 to one-half of the space and projects them to a plane to be illuminated.

The light beams from the light source means 31 are directed to an incident plane 34a of a fly-eye lens (optical integrator) 34 having a plurality of small lenses arranged two-dimensionally. An exit plane 34b of the fly-eye lens 34 is a secondary light source plane having a uniform luminance. The light beam from the exit plane 34b is collimated by a collimating lens 35 and directed to a reaction chamber (not shown) of the photo-excited processing apparatus in which raw gas is filled, through a light transmissive window.

FIG. 4 shows only light source means 41 of an illumination system. The light source means 41 comprises a light source 42 having a plurality of bar-shaped lamps (42a, 42b, . . .) having long light emitting planes in a direction perpendicular to the plane of the drawing arranged one-dimensionally and a plurality of cylindrical mirrors (43a, 43b, . . .) each having a center of curvature on a light emitting line of the light source 42 for reflecting the light beams from the light source 42. The light beams from the light source means 41 are directed to a reaction chamber (not shown) of the photo-excited processing apparatus through a light transmissive window.

FIG. 5 shows an illumination system of a distant point light source type. The illumination system of FIG. 5 directly directs the light beams from light source means 51 which is similar to that of FIG. 3 to a reaction chamber (not shown) of the photo-excited processing apparatus through a light transmissive window.

In the illumination system of FIG. 3 which uses the fly-eye lens 34, when the light intensity of the light source 32 is raised, the fly-eye lens 34 is heated and clouded so that a transmittance is lowered. Further, when a light source which emits light beams of a wide wavelength band is used, chromatic aberration occurs from the fly-eye lens 34 and it is difficult to attain uniform illumination.

In the illumination system of FIG. 4, the light source means 41 is complex and large in size because a number of bar-shaped lamps are required. Further, when the light source means 41 is spaced from the light transmissive window in order to attain a uniform distribution of illumination, the illumination on the plane to be illuminated is abruptly lowered.

In the illumination system of the distant point light source type of FIG. 5, when the light source means 51 is spaced from the light transmissive window in order to attain a uniform distribution of illumination on the plane to be illuminated as is done in the illumination system of FIG. 4, the illumination on the plane to be illuminated is abruptly lowered.

SUMMARY OF THE INVENTION

It is an object of the present invention to provide a photo-excited processing apparatus and a method for manufacturing a semiconductor device by using the same, which can illuminate with a high illumination and less chromatic aberration by illuminating a plane to be illuminated in a reaction chamber through a light transmissive window with a uniform distribution of illumination and with effected utilization of light beams by properly constructing elements of the illumination system.

DETAILED DESCRIPTION OF THE PREFERRED EMBODIMENTS

Figure 1:
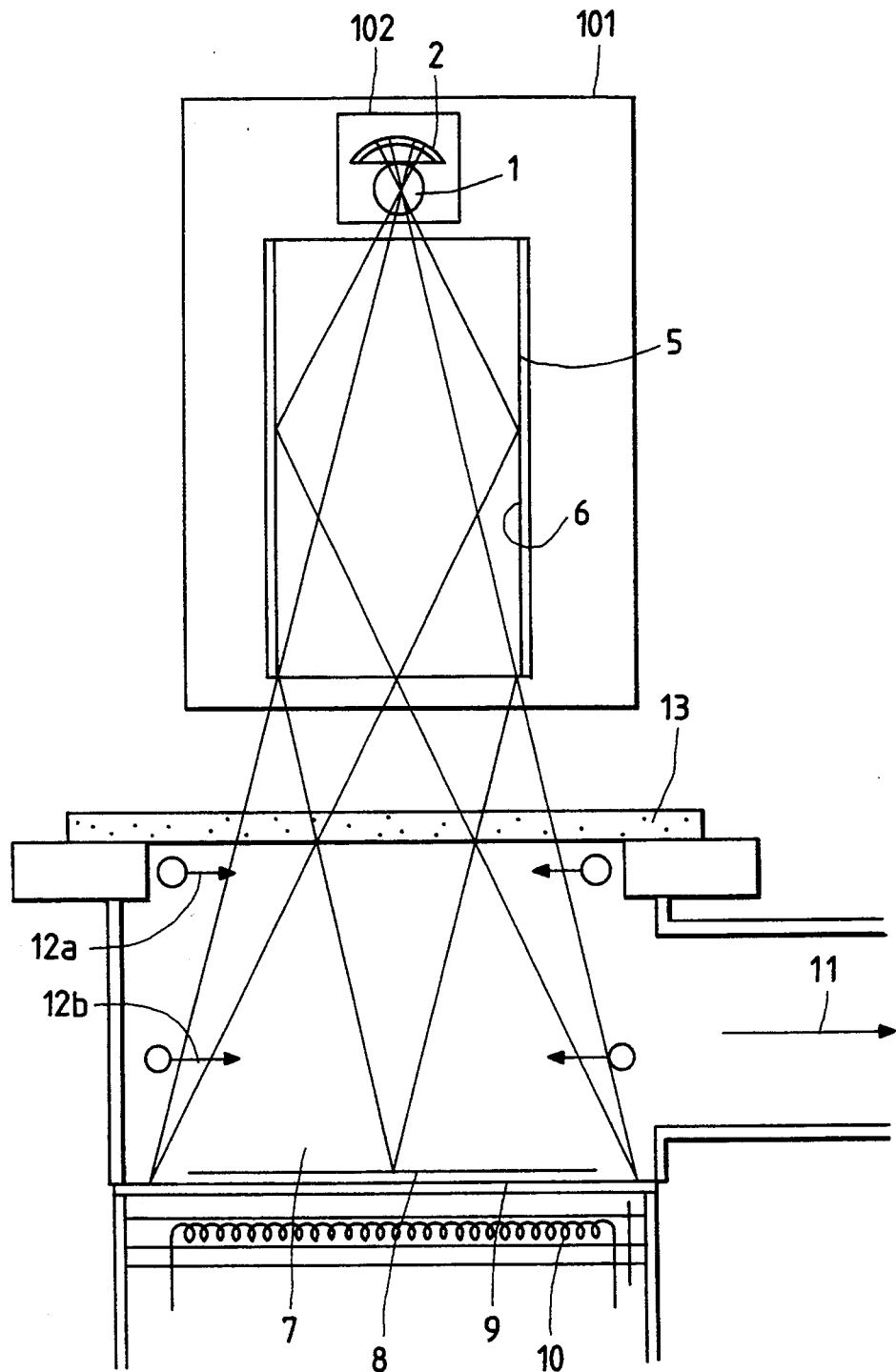
FIG. 1 shows a schematic view of a photo-excited processing apparatus of the present invention.

FIG. 1 shows a schematic view of a photo-excited processing apparatus of the present invention. In FIG. 1, numeral 101 denotes an illumination system which comprises light source means 102 and a cylindrical reflection member 5.

The light means 102 comprises a light source 1 and a reflector 2. The light source 1 is a high pressure Hg lamp, Xe-Hg lamp, Xe lamp or laser having a generally point-shaped light emitting plane. The reflector 2 is a concave mirror, parabolic mirror or elliptic mirror (in which case a light emitting point is located at one focus point) having a center of curvature at a light emitting point of the light source 1.

The cylindrical reflection member 5 is a cylindrical mirror having a center axis passing through the center of light emission of the light source 1 and having a reflection plane 6 made of Al or the like on inner surface thereof. The reflection plane 6 may be a simple mirror reflection plane or a reflection plane having a number of minute reflective spherical surfaces, or a diffusion reflection plane or the like.

A portion of the light beams emitted from the light source 1 which is in the vicinity of the center of light emission is directly directed to a light transmissive window of a reaction chamber to be described later, and the light beams radiated to peripherals from the center of light emission are reflected by the inner reflection plane 6 of the cylindrical reflection member 5 and directed to the light transmissive window of the reaction chamber. In this manner, a surface of a substrate as the plane to be illuminated in the reaction chamber is uniformly illuminated at a high illumination while the light beams are effectively utilized.

Numeral 7 denotes the reaction chamber in which raw gases 12a and 12b for depositing thin films on a surface of a wafer (substrate) to be described later are filled. Numeral 13 denotes the light transmissive window made of quartz. It is provided at a portion of the reaction chamber 7. The light beams from the illumination system 101 pass through the light transmissive window 13 and are directed into the reaction chamber 7. Numeral 8 denotes a wafer such as an Si substrate which is mounted on a suscepter 9. Numeral 10 denotes heating means (heater) which heats the wafer 8. Numeral 11 denotes evacuated gas from the reaction chamber 7.

In the photo-excited processing apparatus of the present invention, the raw gases 12a and 12b in the reaction chamber are excited by an energy of the light beams from the illumination system 101 to form a thin film on the surface of the substrate (wafer) 8 to manufacture a semiconductor device. An embodiment thereof is explained below.

FIRST EMBODIMENT FOR THE MANUFACTURING PROCESS

The substrate 8 is mounted on the suscepter 9 and a current is supplied to the heater 10 to heat the substrate 8 from a room temperature to a desired temperature of several hundreds ° C. Then, the raw gases 12a and 12b are flown and they are maintained at a desired pressure between 0.1 Torr and 100 Torr by a conductance valve (not shown) provided in the evacuation path 11. The light source 1 is lit and a film formation is conducted until a desired thickness is reached on the surface of the substrate 8.

The high pressure mercury lamp was used, the supplied raw gases 12a and 12b were $Si_2H_6$ at 20 sccm and $NH_3$ at 150 sccm, the pressure was 3 Torr, the substrate temperature was 300° C. and the illuminance was 130 mW/cm$^2$. Under this condition, the film formation was conducted on the substrate of 6" diameter. An SiN film of good quality was formed at a relatively high rate of 35 mm/min with the uniformity of +3%.

By changing the raw gases in the present embodiment, insulation materials such as SiN, $SiO_2$, $Ta_2O_5$, $Al_2O_3$ and AlN, semiconductors such as a-Si, poly-Si and GaAs and metals such as Al and W can be deposited.

In the present embodiment, the thin film is formed on the surface of the substrate (wafer) 8 in the method described above, and an electronic circuit pattern is formed on the surface of the wafer, and then a semiconductor device is fabricated by a known method.

SECOND EMBODIMENT FOR THE MANUFACTURING PROCESS

In the present embodiment, the inner surface 6 of the cylindrical reflection member 5 of the illumination system 101 of FIG. 1 is made to a diffusion plane made of Al rough surface. Other elements are identical to those of FIG. 1.

Like the embodiment of FIG. 1, the substrate 8 is mounted on the suscepter 9, and a current is supplied to the heater 10 to heat the substrate 8 from a room temperature to a desired temperature of several hundreds ° C. Then, the raw gases 12a and 12b are flown and they are maintained at a desired pressure between 0.1 Torr and 100 Tort by a conductance valve (not shown) provided in the evacuation path 11. The light source 1 is lit and a film formation is conducted until a desired thickness is reached.

The high pressure mercury lamp was used, the supplied raw gases 12a and 12b were $Si_2H_6$ at 20 sccm and $NH_3$ at 150 sccm, the pressure was 3 Torr, the substrate temperature was 300° C. and the illuminance was 130 mW/cm$^2$. Under this condition, a film formation was conducted on the substrate of 6" diameter. As a result, an SiN film of high quality was formed at a relatively high rate of 40 nm/min with the uniformity of ±2%.

In the present embodiment, insulation materials such as SiN, $SiO_2$, $Ta_2O_5$, $Al_2O_3$ and AlN, semiconductors such as a-Si, poly-Si and GaAs and metals such as Al and W can be deposited by changing the raw gases.

Figure 2:
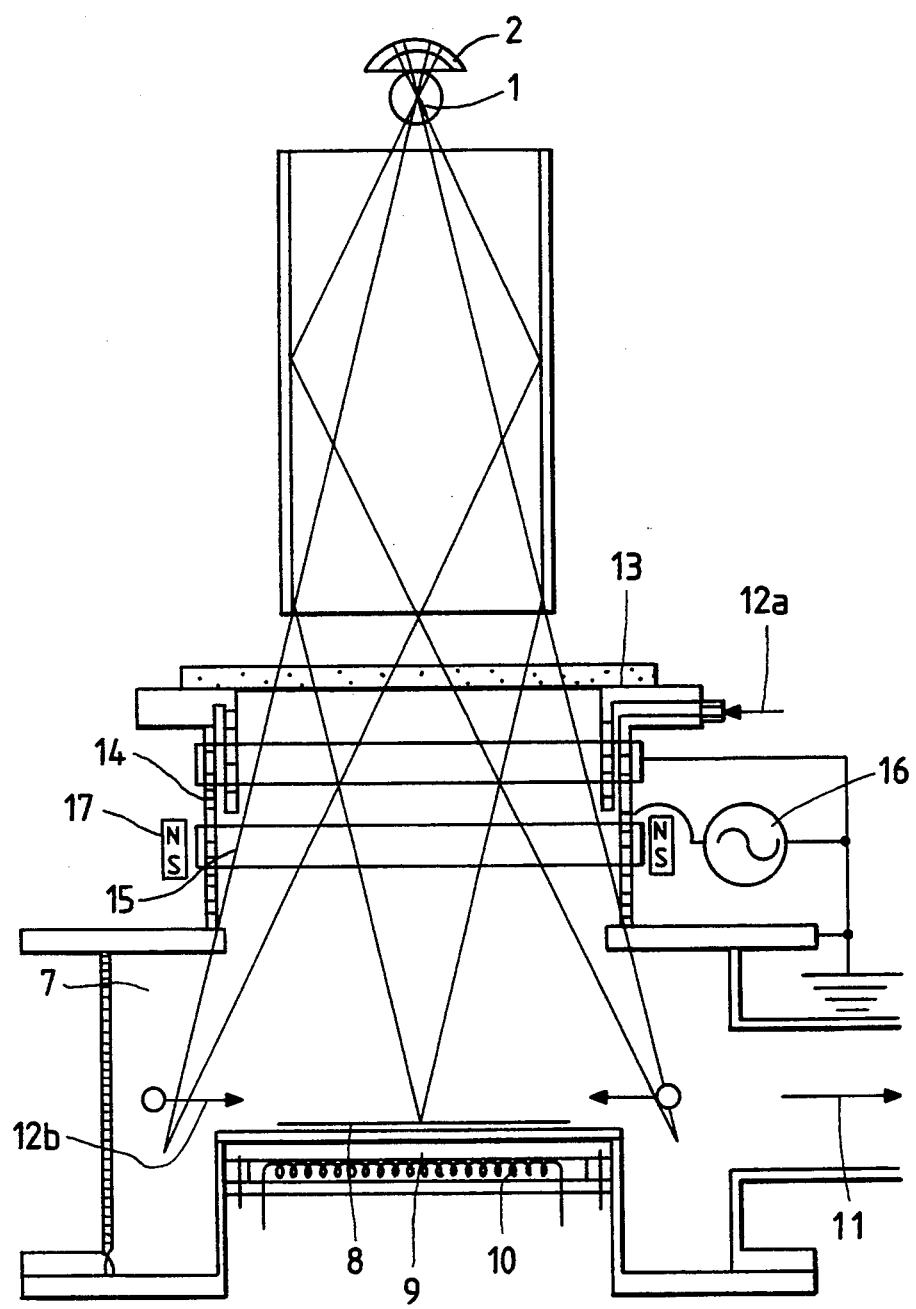
FIG. 2 shows a view when the present invention is applied to a photo-assisted plasma CVD apparatus.
Figure 3:
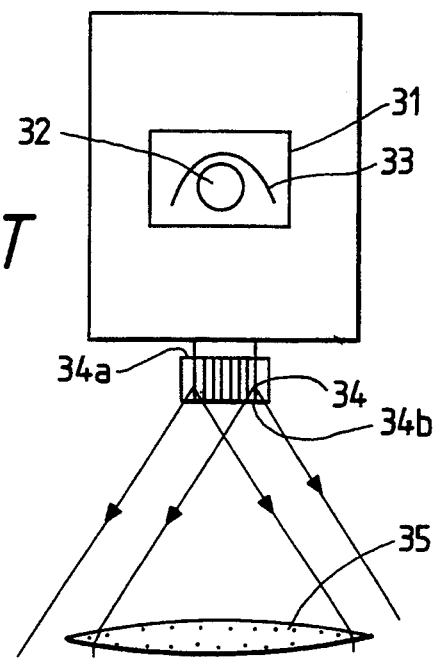
FIG. 3 shows an illumination system of a conventional photo-excited processing apparatus.
Figure 4:
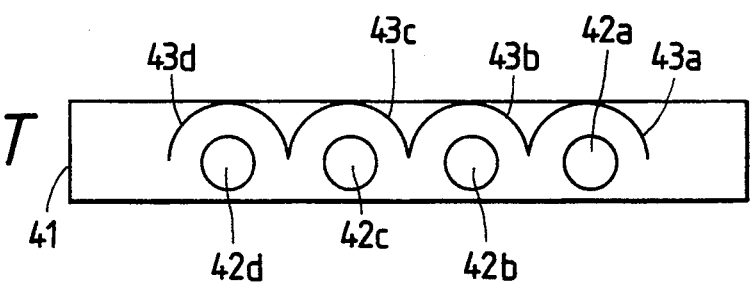
FIG. 4 shows a portion of an illumination system of a conventional photo-excited processing apparatus.
Figure 5:
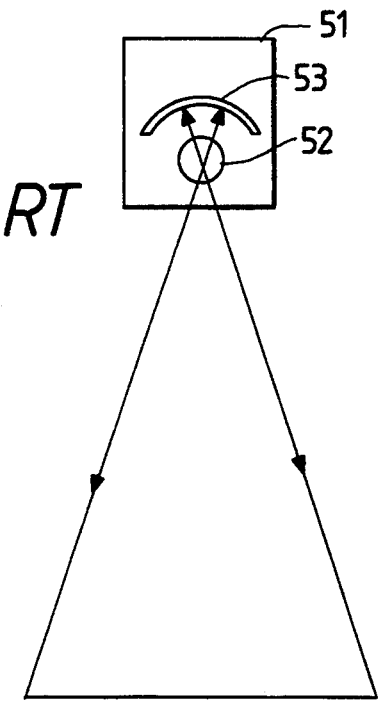
FIG. 5 shows a portion of an illumination system of a conventional photo-excited processing apparatus.

FIG. 2 shows another embodiment of the photo-excited processing apparatus of the present invention. The present embodiment relates to a photo-assisted plasma CVD apparatus. In FIG. 2, the like elements to those shown in FIG. 1 are designated by the like numerals.

In FIG. 2, numeral 14 denotes a quartz tube, numeral 15 denotes an RF electrode, and numeral 16 denotes an RF power supply which supplies a power to the RF electrode 15. Numeral 17 denotes a magnet which generates a magnetic field normal to an electric field in the vicinity of the RF electrode 15.

In the present embodiment, the substrate 8 is mounted on the suscepter 9, the light source 1 is lit and a current is supplied to the heater 10 to heat the substrate 8 from a room temperature to a desired temperature of several hundreds ° C. Then, the raw gases 12a and 12b are flown and they are maintained at a desired pressure between 10 mTorr and 1 Torr by a conductance valve (not shown) provided in the evacuation path 11. Under the presence of a magnetron magnetic field of several hundreds G by the magnet 17, the RF power generated by the RF power supply 16 is supplied to the RF electrode 15 to generate a plasma which is localized at the vicinity of the RF electrode 15. A film formation is conducted on the surface of the substrate 8 until a desired thickness is reached.

An Xe lamp was used, the supplied raw gas 12a was TEOS at 200 sccm, the supplied raw gas 12b was $O_2$ at 2 slm, the pressure was 0.1 Torr, the substrate temperature was 300° C., the illuminance was 0.6 W/cm$^2$, the RF power was 500 W and the magnetic flux density was 230 G. Under this condition, a film was formed on the substrate of 6" diameter. As a result, an $SiO_2$ film of a high quality having a hydrogen composition of less than 2 atm % and a tensile stress of $2 \times 10^8$ dyne/cm$^2$ was formed at a relatively high rate of 220 nm/min with the uniformity of ±3%.

In the present embodiment, insulative materials such as SiN, SiO$_2$, Ta$_2$O$_5$, Al$_2$O$_3$ and AlN, semiconductors such as a-Si, poly-Si and GaAs and metals such as Al and W can be deposited by changing the raw gases.

In accordance with the photo-excited processing apparatus and the method for manufacturing the semiconductor device by using the same of the present invention, since the elements of the illumination system are properly constructed, the plane to be illuminated in the reaction chamber are illuminated with the uniform distribution of illumination through the light transmissive window while the light beams are effectively utilized so that the light beams are irradiated at a high illuminance with less chromic aberration.

What is claimed is:

1. A photo-excited processing apparatus comprising:
   a radiation source;
   a reaction chamber provided with a light-transmissive window being filled therein with reacting gas photo-excited by a radiation beam transmitting through said transmissive window; and
   an illumination member arranged between said irradiation source and said reaction chamber, said illumination member having a concave - cylindrical-shaped reflecting surface for reflecting a part of the irradiation beam coming from said irradiation source and making the irradiation beam coming from said radiation source incident onto said light-transmissive window provided in said reaction chamber.

2. A photo-excited processing apparatus according to claim 1, wherein said reflecting surface of said illumination member has a plurality of mirrors each having a spherical surface.

3. A photo-excited processing apparatus according to claim 1, wherein said reflection surface of said illumination member is a rough surface.

* * * * *

UNITED STATES PATENT AND TRADEMARK OFFICE
CERTIFICATE OF CORRECTION

PATENT NO. : 5,368,647
DATED : November 29, 1994
INVENTOR(S) : NOBUMASA SUZUKI

It is certified that error appears in the above-identified patent and that said Letters Patent is hereby corrected as shown below:

COLUMN 1

Line 23, "particularity" should read --particularly--.
Line 39, "is" should read --as--.

COLUMN 3

Line 4, "inner" should read --an inner--.
Line 61, "+3%." should read --±3%.--.

COLUMN 4

Line 18, "100 Tort" should read --100 Torr--.

COLUMN 6

Line 7, "concave - cylindrical-" should read
--concave-cylindrical- --.

Signed and Sealed this

Eleventh Day of April, 1995

*Attest:*

BRUCE LEHMAN

*Attesting Officer*  *Commissioner of Patents and Trademarks*